United States Patent [19]

Nair

[11] Patent Number: 4,700,316

[45] Date of Patent: Oct. 13, 1987

[54] AUTOMATED BOOK LAYOUT IN STATIC CMOS

[75] Inventor: Ravindra K. Nair, Peekskill, N.Y.

[73] Assignee: International Business Machines Corporation, Armonk, N.Y.

[21] Appl. No.: 707,353

[22] Filed: Mar. 1, 1985

[51] Int. Cl.$^4$ ............................................. H03K 19/09
[52] U.S. Cl. ..................................... 364/488; 364/491
[58] Field of Search ................................ 364/488–491; 29/576 R, 577 R, 577 C; 357/40, 45, 51, 68

[56] References Cited

U.S. PATENT DOCUMENTS 4,584,653 4/1986 Chih et al. ........................... 364/491
4,591,993 5/1986 Griffin et al. ........................ 364/491

Primary Examiner—Gary V. Harkcom
Assistant Examiner—H. R. Herndon
Attorney, Agent, or Firm—Jack M. Arnold; Terry J. Ilardi

[57] ABSTRACT

A method of generating the layout of CMOS cells from a high-level functional description of the cells, as well as generating the particular details of the CMOS device. In particular, the image of the chip is formed having the polysilicon gates of the transistors on the n-side vertically aligned with those of the p-side vertically aligned with those of the p-side to minimize the wiring effort. The interconnections between the source and drains are orthogonal to the gates, and run along one layer of metal.

11 Claims, 32 Drawing Figures

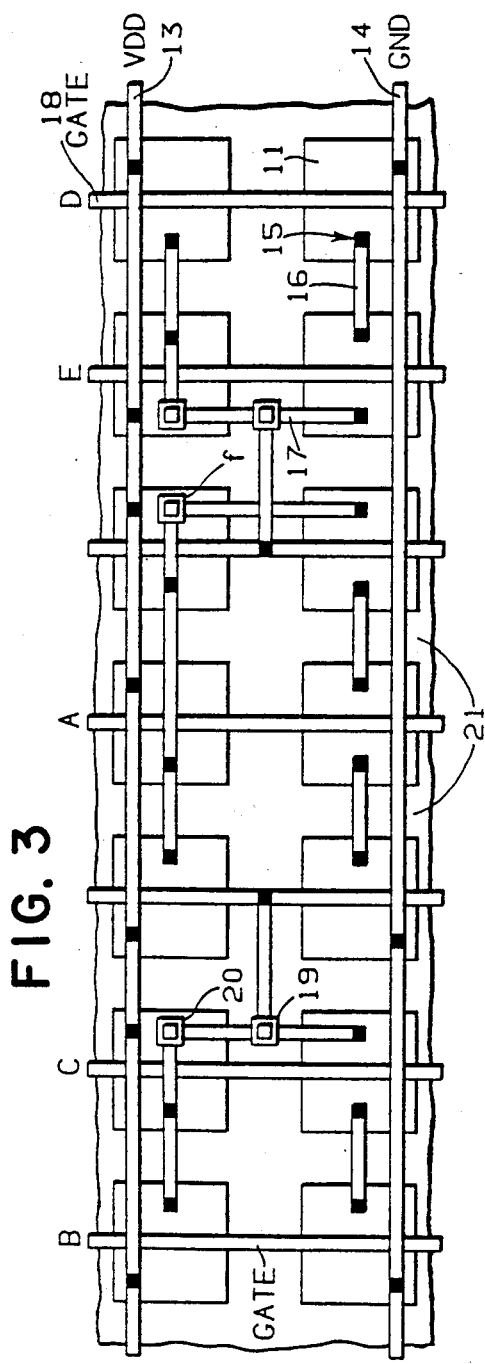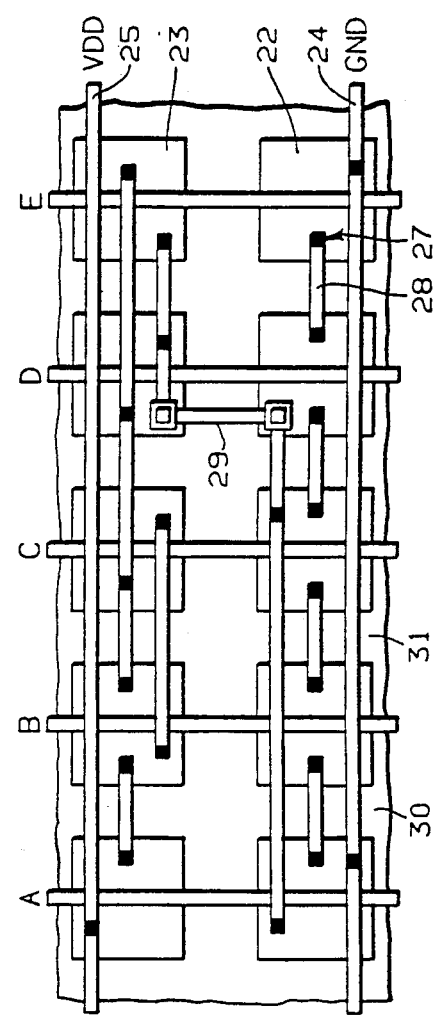
FIG. 3
FIG. 4

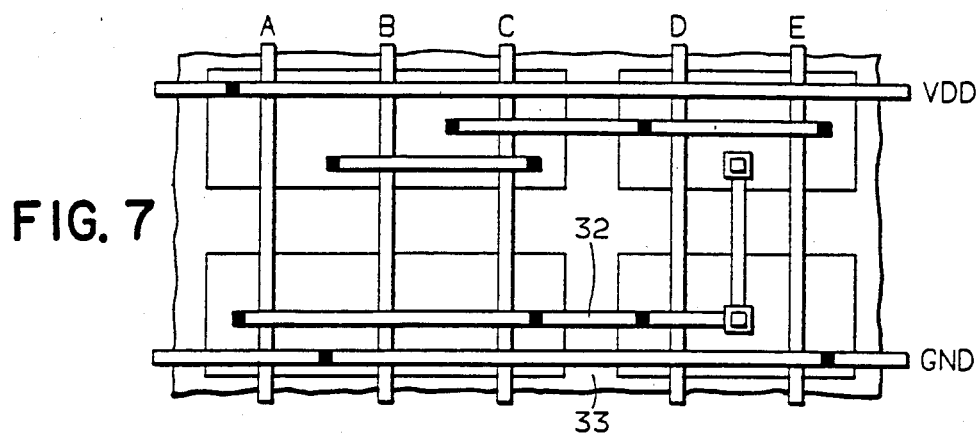
FIG. 7
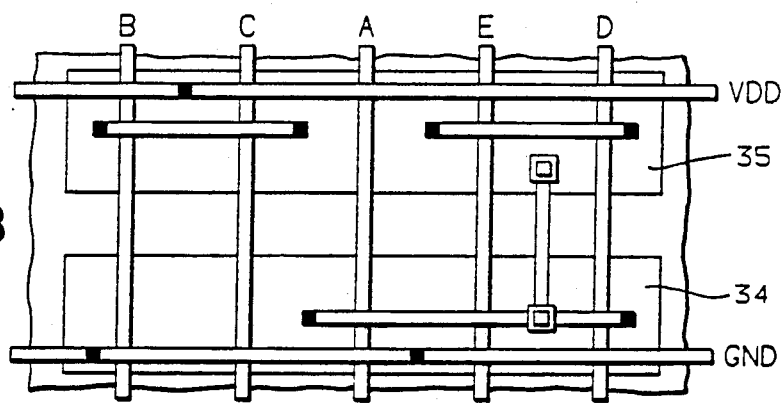
FIG. 8
FIG. 9
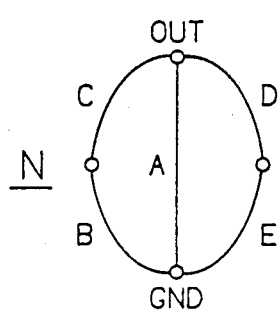
FIG. 10
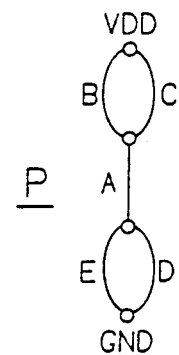

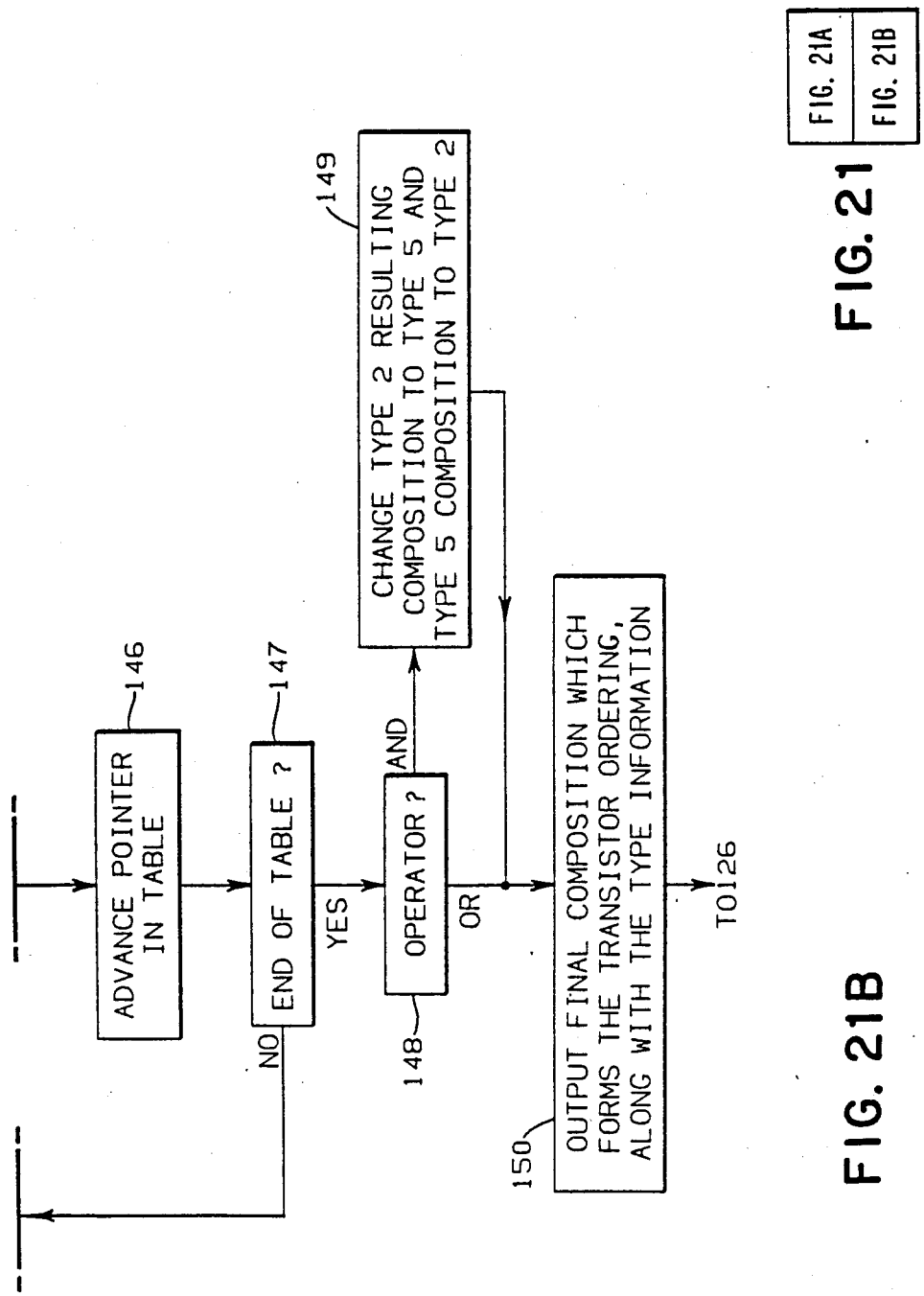

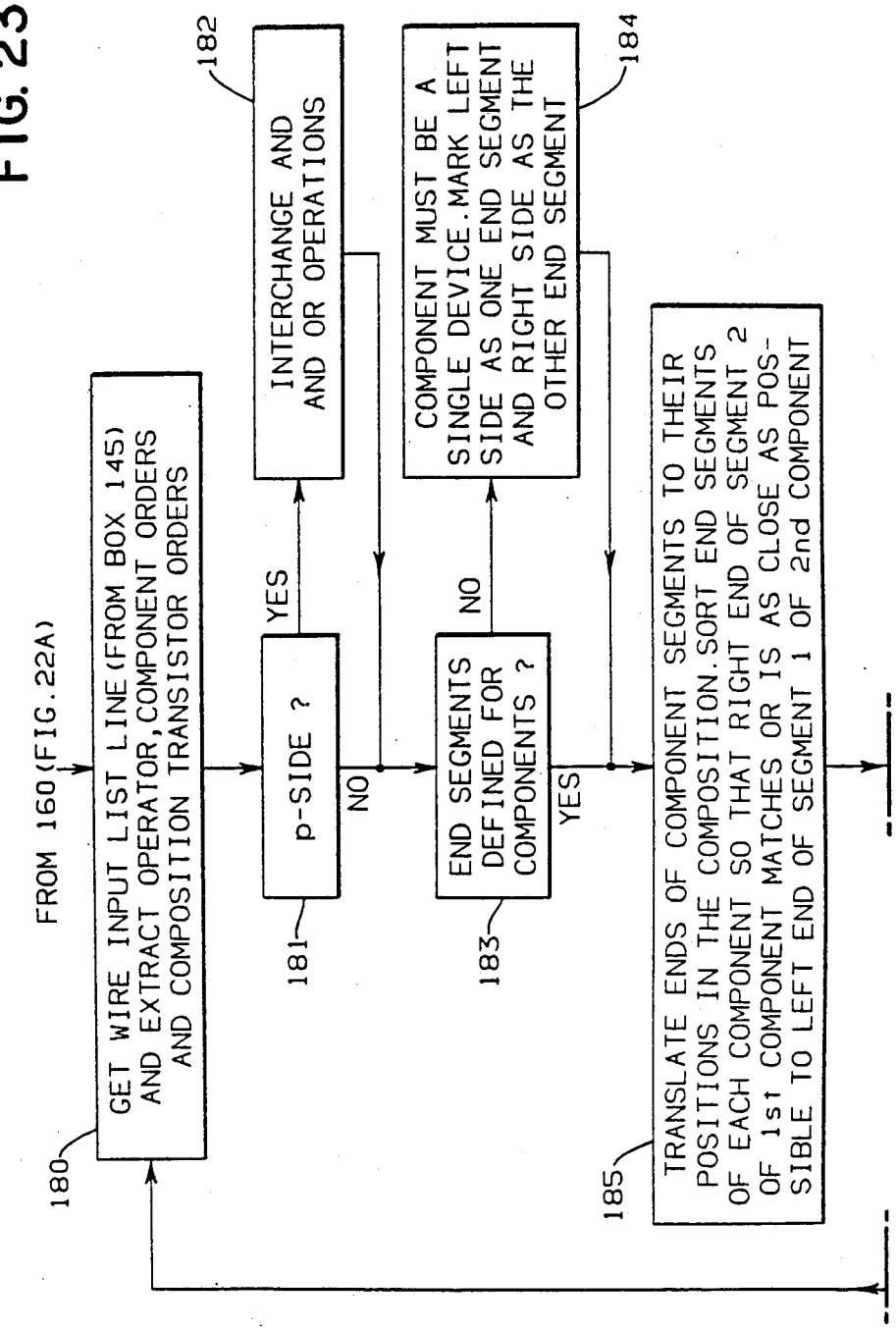

AUTOMATED BOOK LAYOUT IN STATIC CMOS

BACKGROUND OF THE INVENTION

1. Field of the Invention

This invention relates to design automation systems and methods and particularly to an enhanced method for preparing data for processing semiconductors, and more particularly, to the processing of complementary metal oxide semiconductor (CMOS) devices.

2. Description of the Prior Art

Since the advent of large scale integrated circuits (LSI), it has become possible to fabricate many thousands of circuits on a single semiconductor wafer chip. Proportional to the number of LSI circuits that may be fabricated on a single semiconductor chip is the complexity of the procedure for arranging such circuits for proper interconnection and isolation. This complexity has necessitated the creation of computer aided automatic design systems.

Typical of prior art directed to automatic circuit design systems are U.S. Pat. No. 3,475,621 issued Oct. 28, 1969 to A. Weinberger, U.S. Pat. No. 3,567,914 issued Mar. 2, 1971 to J. L. Neese, et al, and Defensive Publication No. T940,020 published Nov. 4, 1975 by G. E. Brechling, et al. These prior art systems typically disclosed techniques for devising orthogonal coordinates and using these coordinates to provide interconnect points for logical elements in the circuits to be fabricated. The techniques are sometimes referred to as cellular logic design and the logic elements are referred to as "cells." Data describing the logic elements, the orthogonal coordinates, and the interconnect points for the logical elements are input to a data processing unit and a circuit generation program operates the data processing unit to provide interconnection between the circuit elements or cells. However, these prior art systems are limited in the complexity of the circuits that can be fabricated using them because each requires a specification of all possible logic cells used with all possible interconnect points between the cells to enable fabrication of the logic function in a single pass. For example, a two-input NAND gate has 12 possible input and output wiring pattern combinations allowing only for vertical and horizontal wiring with fixed input and output locations. With the prior art systems, data describing each of these possible NAND gate configurations as a complete entity must be stored in the system. Each configuration is considered a cell. In addition to the input and output wiring configurations, multiple power levels could be needed for the technology. If two power options were available, the number of cells required increases to 24. The NAND gate may be used in combination with other basic logic cells, for example, OR, AND, NOR, and NOT. Each of these circuits requires a separate configuration, adding to the multiplicity of cells. This limits prior art techniques to relatively simple construction or to very specific implementation of more complex structures, for example, the high density logic array disclosed in U.S. Pat. No. 3,987,287 issued Oct. 19, 1976 to Cox et al. Furthermore, using the prior art techniques produces a circuit pattern that is not conducive to modification. Any change in any of the cells in the circuit requires a totally new circuit to be produced.

U.S. Pat. No. 4,377,849 to Finger et al, which is assigned to the assignee of the present invention seems to simply provide a way in which a layout can be developed hierarchically by allowing the description of basic cells which can then be assembled to form a larger macro. The cells are designed by hand rather than being generated automatically. Their cells are basic physical units which can be laid out on some rather small grid. There is no generation of the layout from the Boolean equation or some functional description of the circuit. Even in the single PLA example which is described, it appears as though the minimal functional form of the PLA itself is accomplished outside their package.

Other U.S. patents of general interest for their respective disclosures of integrated circuit structures are numbers 4,212,026; 4,218,693; 4,233,526; 4,402,044; and 4,412,240.

None of the methods described above can be utilized for the generation of static CMOS book layouts. According to the present invention, the layout of the functional circuits is generated from a Boolean equation. A computer program generates the layout of CMOS books from a high level functional description of the book. Such a program is useful in two respects. First, it may be used to design a book set in a minimal amount of time. Second, it may be used as a part of a synthesis system where the front end maps the logic into a set of series-parallel networks, with the program generating the layout of each such network. The input to the program is a description of the logic of the network in terms of AND and OR functions with an inverter at the output.

DISCLOSURE OF THE INVENTION

A method for processing semiconductor chips and, in particular, a method of generating the layout of CMOS cells from a high-level functional description, such as a Boolean equation, of the cells as well as generating the particular details of the CMOS device. The image of the chip is formed having the polysilicon gates of the transistors on the n-side vertically aligned with those of the p-side to minimize the wiring effort. The interconnections between the source and drains are orthogonal to the gates, and run along one layer of metal.

BRIEF DESCRIPTION OF THE DRAWINGS

FIG. 3 is one possible physical implementation of the NAND gate implementation of FIG. 2;

FIG. 4 is a single gate implementation of the Boolean function $f = A + BC + DE$;

FIG. 7 is a more compact physical implementation of the function of FIG. 4, which is obtained by sharing diffusion regions;

FIG. 8 is a preferred implementation of the function $f = A + BC + DE$, assuming the necessity of VDD and ground busses;

FIGS. 9 and 10 are representative interconnection graphs of the n-side and p-side, respectively, of the implementation of FIG. 8;

DESCRIPTION OF THE PREFERRED EMBODIMENTS

Figure 1:
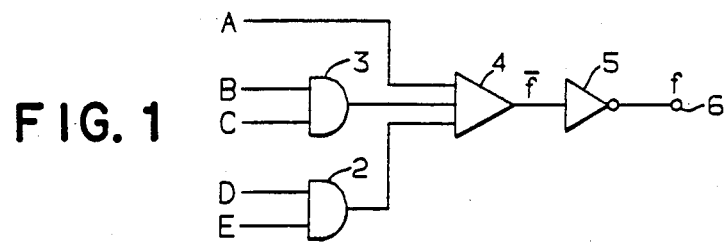
FIG. 1 is a schematic diagram of the Boolean function $\bar{f}$ $A+BC+DE$ implemented utilizing AND, OR, and NOT gates.

The following describes a design automation technique for layouts of CMOS logic networks in silicon, and in particular a computer program is described which generates the layout of CMOS books from a high level functional description of the book. The input to the program is a Boolean description of the logic of the network which can be implemented in terms of AND and OR functions with, in certain instances, a single inverter at the output. The program may be run on any general purpose computer, for example, the IBM System 370 computer.

An image of the silicon chip which is to carry the book of the CMOS circuit is characterized by the fact that the polysilicon gates for the transistors on the n-side are vertically aligned with those of the p-side so as to reduce the wiring effort within the book. Further, the inner connections between the sources and the drains of the transistors are orthogonal to the gates and run along only one layer of metal. A second level of metal is used for interconnecting the output of the p-side with that on the n-side. This is not necessary, though, since the program ensures that the outputs of both sides are on adjacent tracks and overlap enabling a direct connection.

Often a transistor which is adjacent to another in the layout has a drain which is connected to the source of the other or vice versa in both the p and n-sides. In this case, it is advantageous to have these transistors oriented so that their diffusion regions may be shared. This avoids a metal interconnection involving via contacts and often results in fewer horizontal wiring tracks.

The problem of maximizing the sharing of diffusion regions is one of determining a set of paths through the graph representing the n-side which also forms a set of paths through the graph representing the p-side. There are instances, though, where minimizing the number of diffusion breaks could lead to a horizontal track requirement for interconnections which is larger than that which would be obtained if more diffusion breaks were allowed. On more detailed analysis one may see that this happens especially if the transistors that are connected to a given node in the graph are spread out too far from each other. The computer program hence takes advantage of this observation by looking at local regions of the graph when optimizing the number of diffusion breaks.

A further observation is that computing groups of series and parallel compositions, while not changing the logical function of the graph, could result in better layout characteristics. The program takes this into account also. If by computing the order of some groups, or by flipping the orientation of some groups, a reduction in diffusion breaks results, the program does so.

Often, the ground and VDD wiring is provided in the form of a bus running in parallel with the metal interconnections, orthogonal to the transistors. This changes the nature of the wiring interconnection problem, because ordinary stick-packing which produces optimal results through a greedy algorithm, no longer suffices. It is now necessary to exchange the output line with the VDD line on the p-side or the output line with the ground line on the n-side to see whether a better result is obtained. The program provides provisions for these type of checks also.

Further, the track assignment also could affect the ease of connecting the output on the two sides. The program checks, through a maze runner, the best possible way of interconnecting the outputs. Stacked vias, i.e., a via from metal to metal over a via from metal to diffusion is avoided in this process.

The result of this phase of the program is a stick diagram showing the interconnection tracks and the layout permutation with all required breaks. This is then fed into another program which contains the layout topology rules. The output of this program is a topological description of the layout. The technology rules can be easily modified to accommodate various images. The program can also be easily modified to provide additional book layouts, e.g., with buffers, with different transistor dimensions, with butted contacts, with isolation devices instead of diffusion breaks and so on.

Figure 2:
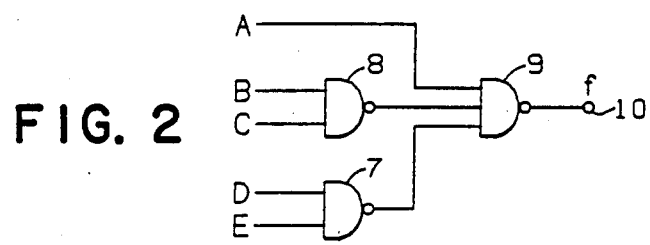
FIG. 2 is a schematic diagram of the Boolean function $f = A + BC + DE$ implemented utilizing NAND gates.

A given boolean function can be implemented in a number of different logic configurations. For example, as illustrated in FIG. 1, the function $f=a+bc+de$ is implemented utilizing OR gates 2 and 3, an AND gate 4 with the resultant signal $\bar{f}$ being inverted by an inverter 5 for providing the function f at an output terminal 6. An alternative implementation is illustrated in FIG. 2 for deriving the function f utilizing NAND gates 7, 8, and 9 with the function being provided at an output terminal 10. Although in certain instances these are acceptable implementations, a static CMOS technology allows one to implement the entire function in a single 'gate', hereafter referred to as a logic cell.

FIG. 3 is a NAND implementation of the logic network shown in FIG. 2. There are n-diffusion regions 11 and p-diffusion regions 12, with a VDD bus 13 being connected to the p diffusion regions and a ground bus 14 being connected to the n diffusion regions. Metal to diffusion contacts 15 are utilized to make metal connections such as at 16 between the respective diffusion regions of the same type. Vertical second level metal connections such as 17 are needed for making connections between the p diffusion 12 and the n diffusion 11. Polysilicon strips 18 function as gates for providing the various input functions to both the p diffusion regions 12 and the n diffusion regions 11. Polysilicon to metal contacts 19 are also required to make various connections between gates, sources and drains. First level metal to second level metal contact connections such as a 20 are also required. It is seen in such implementations that there are "breaks" 21 between each of the diffusion regions resulting in a larger space requirement for fabricating the function on the chip.

A more efficient implementation of the function maybe implemented in CMOS technology. CMOS implementation of the function $f=a+bc+de$ is illustrated in FIG. 4 and is characterized by the presence of a set of n-channel devices including n diffusion regions 22 and a corresponding set of p-channel devices including p diffusion regions 23, each set interconnected in a different, though related manner. The implementation includes a metal ground strip 24 connected to the n diffusion regions and a metal VDD strip 25 connected to the p diffusion regions. Polysilicon strips 26 form respective gate connections for providing input signals to the network. Metal to diffusion contacts 25 are utilized to connect metal strips 28 between the respective diffusion regions. A vertical second level metal strip 29 functions as the output bus of the device. It is seen by inspection, that the "break" regions 30 and 31 are present in this network, and there are specifically four such break regions on both the n-side and p-side of the device. This is two less such "break" regions than was present in the network of FIG. 3. It is seen therefore, that as the number of "break" regions are reduced the more compact the physical embodiment of the function becomes.

Figure 5:
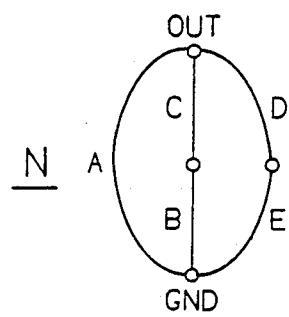
FIGS. 5 and 6 are representative interconnection graphs of the n-side and p-side, respectively, of the implementation of FIG. 4.
Figure 6:
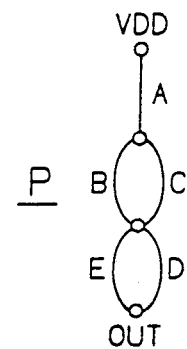

FIGS. 5 and 6 are graphs of the functional boolean representation of the n-channel devices and the p-channel devices, respectively. These graphs show the respective interconnections in the devices, and two facts may be observed from the graphs. First, both graphs are series-parallel in nature and hence planar. Secondly, one graph is the dual of the other in a graph theoretic sense. That is, a series connection in one graph is a parallel connection in the other graph. Comparing with the schematic of FIG. 1, it may be observed that when the elements of FIG. 5 are in series, the corresponding elements of FIG. 6 are in parallel. Further, these elements correspond to the inputs of an AND gate in the schematic.

It is typical for all static CMOS complex logic cells to have the following properties:

1. That the logic function they perform can be represented by a set of AND gates feeding a set of OR gates which in turn feed a set of AND gates and so on, the output of the final stage feeding a NOT gate (an inverter), and 2. That the graph representing interconnections of the devices on the p-side is a dual of that on the n-side.

FIG. 7 shows another implementation of the function f, identical to the one in FIG. 4 except that the metal interconnection segments 32 connecting two diffusion regions adjacent to each other are eliminated by bringing the devices close enough together so that the diffusions touch. That is, the number of breaks 33 that occur on the chip are reduced. It is seen that there is one such break region 33 on each p and n side of the device, whereas in FIG. 4 there were four such breaks per n and p side of the device. It is clear that as the result of this operation, the total width of the circuit has been reduced causing it to have a faster speed of operation. A reduction is also seen in the height of the cell due to a reduction in the number of tracks required for interconnections. This is favorable because it allows greater room for connecting the inputs and outputs of the cell to other cells in a larger system implementation.

FIG. 8 is another implementation of the same logic functions f using the same compacting techniques indicated above. There is a single n diffusion region 34 and single p diffusion region 35, and accordingly there are no "breaks" in the network resulting in a more compact network which operates at higher rate of speed. The series-parallel graphs for this implementation are illustrated in FIGS. 9 and 10. The difference between these graphs and those of FIGS. 5 and 6 derive solely due to a permutation of some operations. Nonetheless this leads to implementation which has even smaller width than the one shown in FIG. 7.

Figure 11:
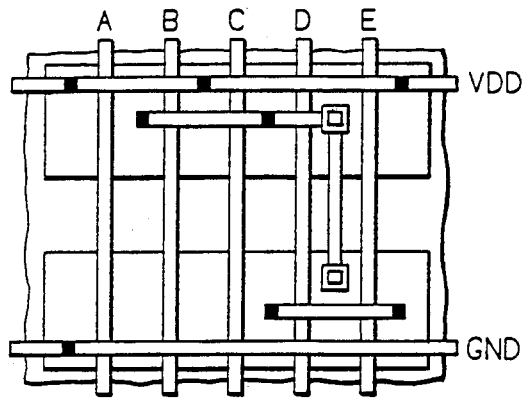
FIG. 11 is an implementation of the function $f=ABC(D+E)$ utilizing 3 tracks on the n-side of the devices.
Figure 12:
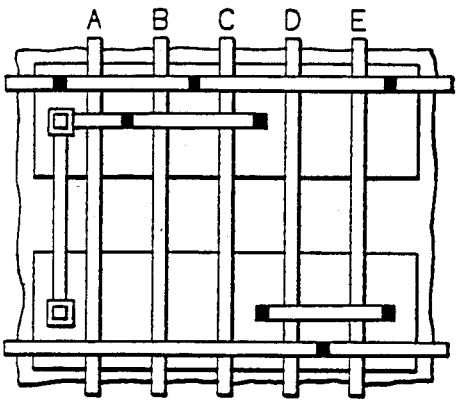
FIG. 12 is an implementation of the function $f=ABC(D+E)$ utilizing 2 tracks on the n-side of the device.
Figure 13:
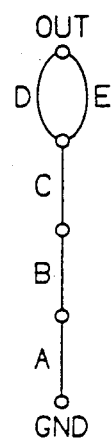
FIGS. 13 and 14 are representative interconnection graphs of the n-side implementations of FIGS. 11 and 12, respectively.
Figure 14:
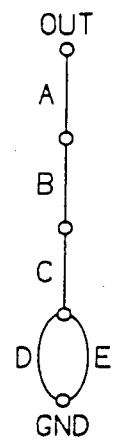

FIGS. 11 and 12 illustrate two implementations of the functions $f=abc(d+e)$. The implementation of FIG. 11 requires three tracks on the n side, whereas the implementation of FIG. 12 requires only two tracks on the n side. The implementation of FIG. 12 is preferred, since it has the minimum number of tracks. The implementation is derived from the graphs of FIGS. 13 and 14. FIG. 13 is the graph for the circuit of FIG. 11 and FIG. 14 is the graph of the circuit of FIG. 12. It is seen that FIG. 14 is FIG. 13 flipped over or turned upside down, with the upside down version of the graph in FIG. 14 resulting in the implementation of FIG. 12 which has fewer tracks on the n side.

The characteristics of a good method of implementing a given AND-OR-NOT schematic static CMOS may be summarized as follows:

1. The devices must be laid out in such a way that the number of pairs of devices that can have touching diffusion, is a maximum.

2. The devices must be laid out in such a way that the number of tracks required for the interconnection of the devices is a minimum.

3. The devices must be laid out in such a way that no permutation of the order of various components appearing in series or the order of the various components appearing in parallel can lead to a more efficient implementation of the function.

4. The orientation of each graph must be chosen in a way that minimizes the number of tracks required for the interconnection of the devices.

There have been attempts in the literature directed to 1 above, however, no other work is known directed to the simultaneous satisfaction of all the constraints mentioned above.

Figure 15:
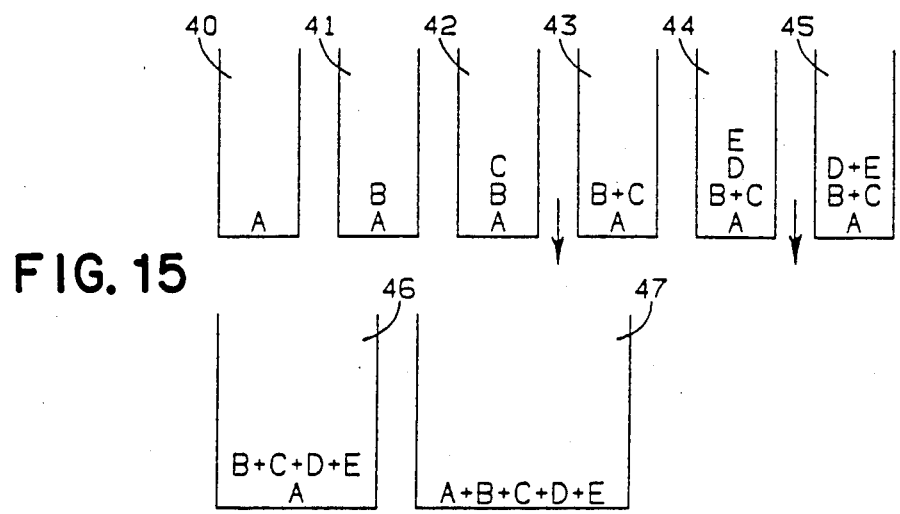
FIG. 15 is a representation of how a stack is operated to produce a postfix notation of a Boolean function.

As stated earlier, CMOS implementation of a given function is derived from the boolean representation of the function. In the program to be described it is assumed that the boolean function is provided in a factorized form. The boolean representation of the function is then converted to a post fix or Late Operator Reverse Polish (LORP) notation using standard stack oriented techniques. Stack oriented techniques are illustrated in FIG. 15 for the boolean function $f=a+bc+de$. At 40, the stack has the operand a placed therein, and at 41 the operand b is placed at the top of the stack, and then at 42 the operand c is placed at the top of the stack. The two top operands in the stack, namely b and c are then combined as b*c and placed at the top of the stack as indicated at 43. Operand d and e are then consecutively placed at the top of the stack as indicated at 44. Since d and e are the two top operands in the stack, they are combined as d*e and placed at the top of the stack as indicated at 45. Since the two top operands in the stack are now b*c and d*e they are combined as b*c+d*e and placed at the top of the stack as indicated at 46. The top two operands in the stack now are a and b*c+d*e, and they are then placed in the stack as the function a+b*c+d*e as indicated at 47.

Figure 16:
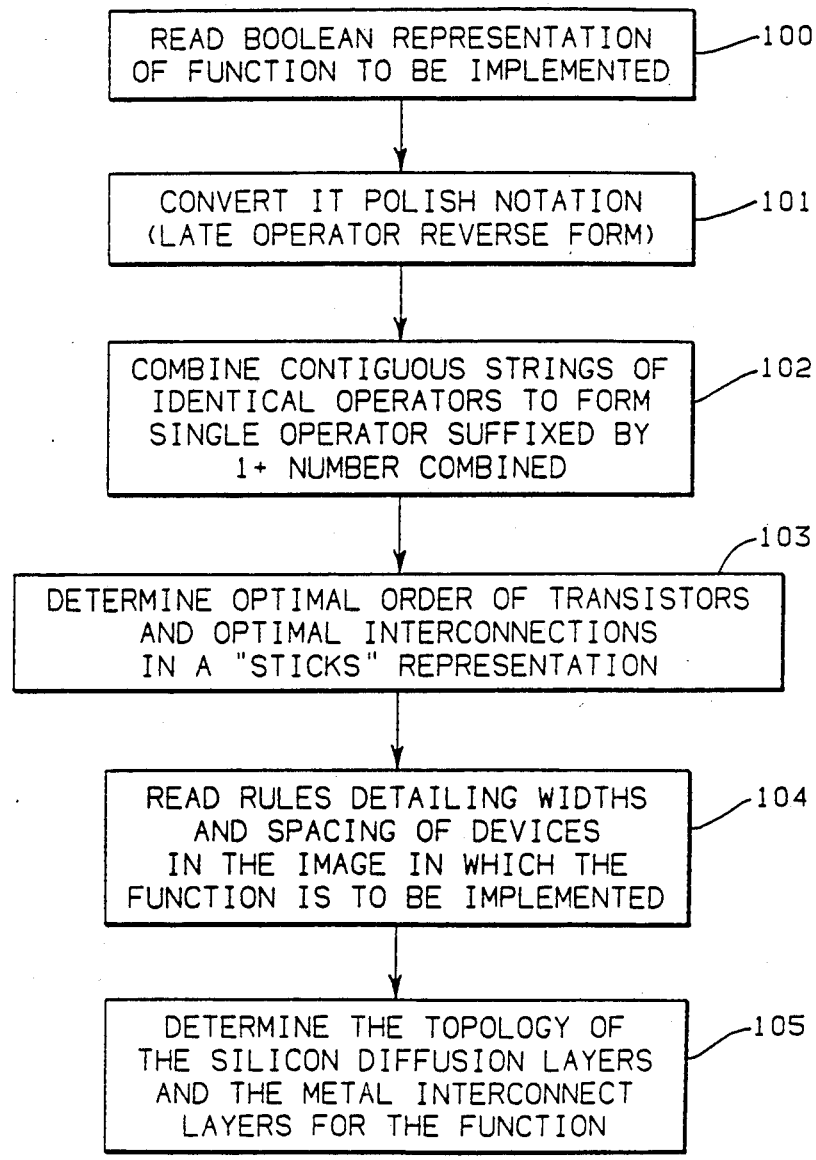
FIG. 16 is a flow chart representation of a method for automatically generating the layout of a CMOS device from the Boolean representation of the function to be implemented on the CMOS device.

FIG. 16 is a flowchart representation of an overview of procedures used to produce a desirable implementation of the boolean function f. The assumption is made as set forth above, that the boolean function is provided in factorized form and is provided as an input to the computer as indicated at logic block 100. At logic block 101 the boolean representation of the function f $$A+B*C+D*E \qquad (1)$$

is converted to a post fix or LORP form as:

$$ABC*DE*++ \qquad (2)$$

This representation is further compacted as indicated logic block 102 to the form $$ABC(*2)DE(*2)(+3) \qquad (3)$$

by simply gathering a contiguous string of like operators and representing the string by the operator followed by the length of the string plus 1. This notation is in a form convenient for input to the procedure in logic block 103 which determines the optimal ordering of transistors and an optimal interconnection between the transistors. Further details of this program are provided in the logic diagrams in FIGS. 18 through 24 and the associated Table 1.

TABLE 1

Composition rules for logic block 145 in FIGS. 4–16.

| TYPE OF OPERAND | | | | TYPE OF |
|---|---|---|---|---|
| $l_1$ | $l_2$ | $l_3$ | COMPOSITION | COMPOSITION |
| 1 | 1 | 1 | $l_1 l_2 l_3$ | 1 |
| 1 | 1 | — | $l_1 l_2$ | 5 |
| 5 | 5 | — | $l_1 l_2$ | 5 |
| 2 | 2 | — | $l_1 l_2$ | 7 |
| 1 | 2 | — | $l_2 l_1$ | 6 |
| 2 | 5 | — | $l_1 l_2$ | 6 |
| 1 | 6 | — | $l_2 l_1$ | 6 |
| 5 | 6 | — | $l_2 l_1$ | 6 |
| 2 | 6 | — | $l_2 l_1$ | 7 |
| 6 | 6 | — | $l_1 R l_2$ | 7 |
| 7 | 7 | — | $l_1 O l_2$ | 7 |
| 1 | 7 | — | $l_2 O l_1$ | 6 |
| 2 | 7 | — | $l_2 O l_1$ | 6 |
| 5 | 7 | — | $l_2 O l_1$ | 6 |
| 6 | 7 | — | $l_2 O l_1$ | 6 |

Figure 17:
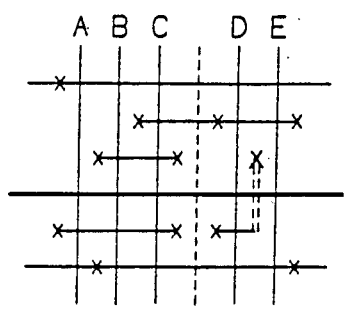
FIG. 17 is a "sticks" representation of the implementation illustrated in FIG. 7.
Figure 26:
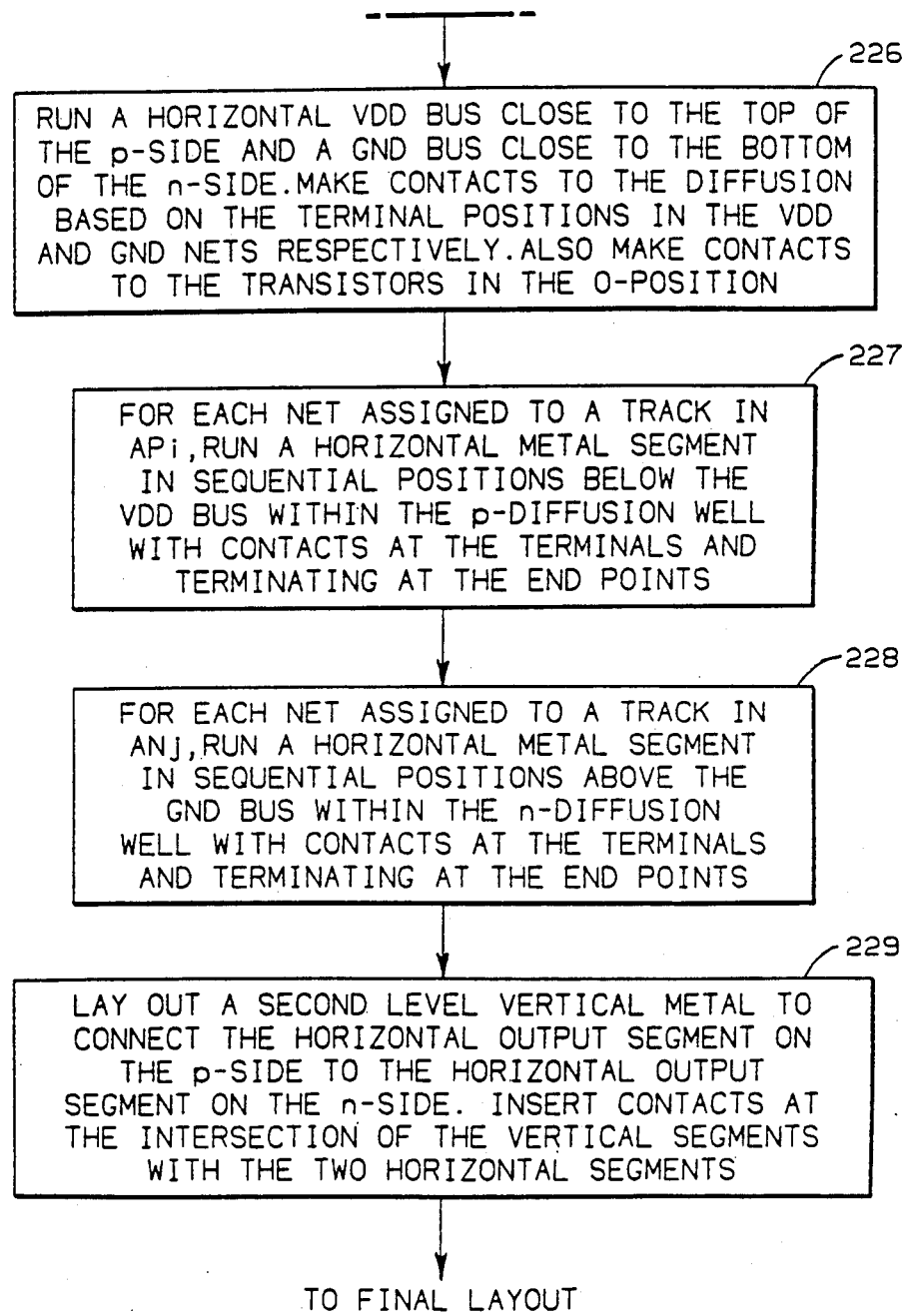

Notes:
$l_1 l_2 l_3$ implies concatenate $l_3$ to the right of $l_2$ which in turn is concatenated to the right of $l_1$
$l_1 R$ implies that string $l_1$ is to be reversed before concatenation
$l_1 O l_2$ implies that an isolation device (or diffusion break) is to be put at the O position The output of logic block 103 is a "sticks" representation of the final layout of the CMOS network as illustrated in FIG. 17. The "sticks" representation is one which does not depend on technology ground rules of the final implementation even though having all the information needed to be used along with the ground rules to produce a final implementation as illustrated in FIG. 7. The technology ground rules are read as indicated in logic block 104 and the final topology of the silicon masks is generated as indicated in logic block 105, the details of which are shown in FIGS. 26 and 27.

Figure 18:
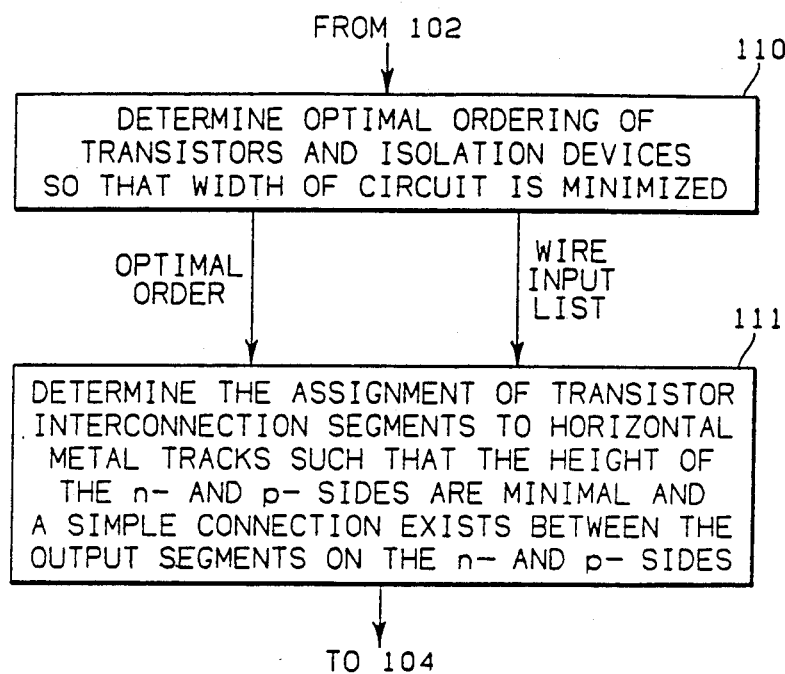
FIG. 18 is a more detailed flow chart representation of logic block 103 of FIG. 16.

FIG. 18 is a detailed logic flow diagram of logic block 103 of FIG. 16 which indicates that the process of generating the "sticks" representation consists of two main steps:

The first as indicated at logic block 110 involving the determination of the optimal ordering of the transistors to maximize the sharing of the diffusion, and hence the minimization or elimination of breaks, and the second as indicated in logic block 111 involving a determination of the orientation of the graph for each of the p- and n-sides along with the interconnections between the devices. The term devices is used interchangeably with the term transistors.

It should be mentioned here that it is often observed that in practice the program manages to achieve a high degree of sharing of the adjacent diffusion regions, leading to implementations having large continuous stretches of diffusion. It is hence easier to think of large diffusion region interspersed by a few diffusion breaks. In fact, it has been observed also that when the number of diffusion breaks is few, it does not degrade the performance while it does improve in the density of the implementation if an "isolation device" is inserted in the position of a break. Such an isolation device involves a transistor on the p-side connected to the power bus VDD and another on the n-side connected to ground.

Figure 19:
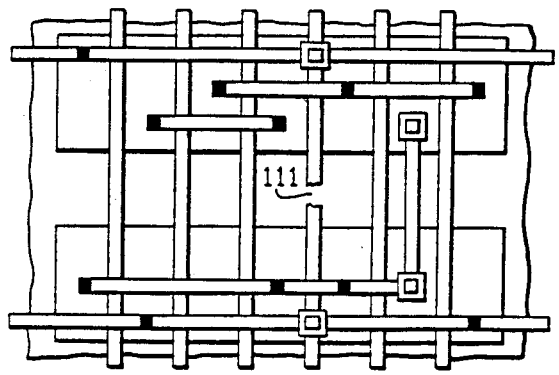
FIG. 19 is an implementation of the function illustrated in FIG. 7 utilizing isolation devices.

FIG. 19 illustrates the implementation of FIG. 7 using isolation devices as indicated at 11 rather than diffusion breaks.

Figure 20:
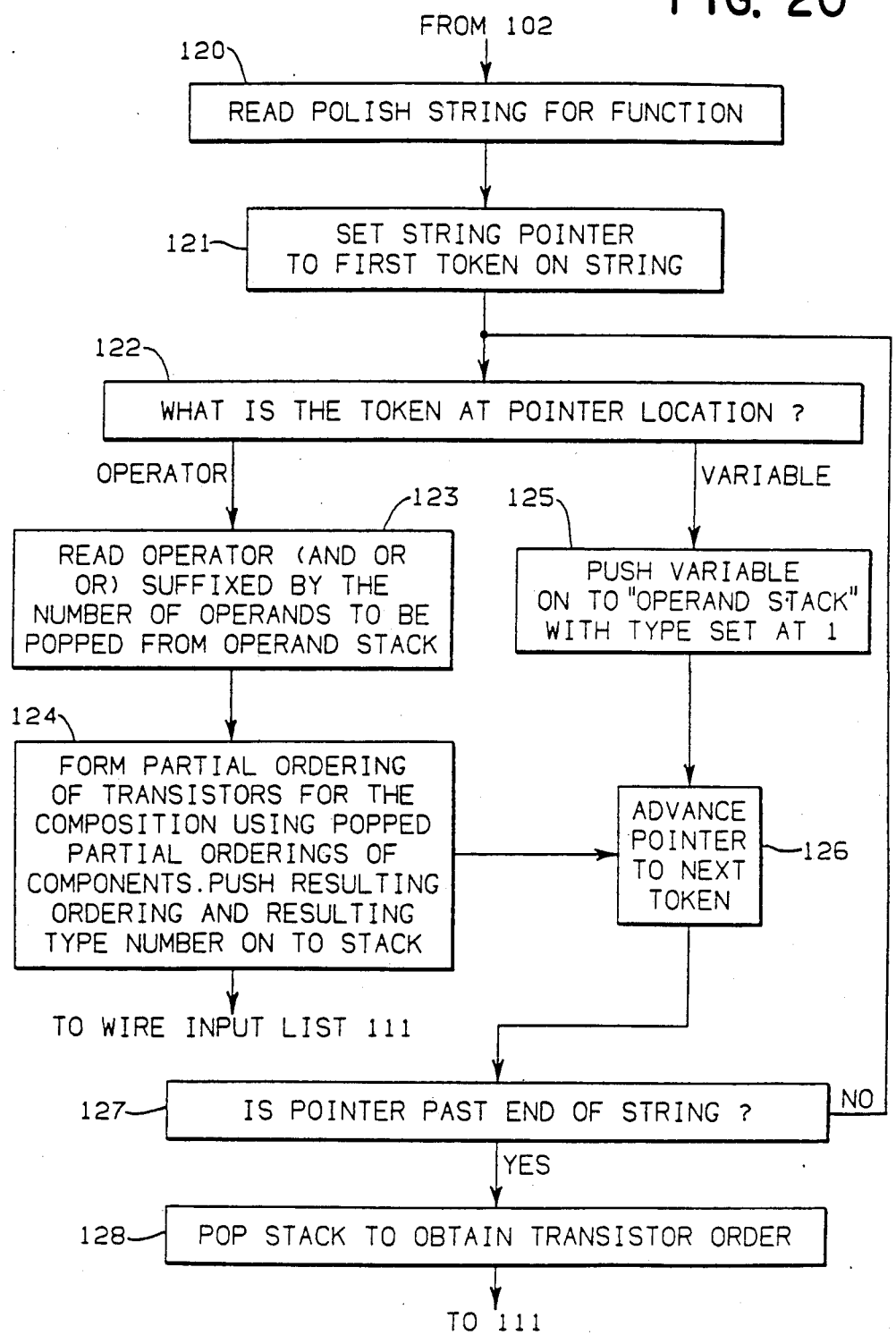
FIG. 20 is a more detailed flow chart representation of logic block 110 of FIG. 18.

FIG. 20 is more detailed logic flow diagram of logic block 110 of FIG. 18 which outlines a recursive procedure to determine the ordering of transistors given an input string in the post fix or LORP form as input from logic block 102 of FIGS. 16 or 18 to logic block 120. As indicated at logic block 121, a string pointer is set to the first token in the string. Each token in the string is examined as indicated 122 to determine if the token is an operator or an operand. If the token is an operand, as indicated in logic block 125, it is stacked along with a type value of 1. If on the other hand, the token is an operator AND or OR, then its suffix is also read as indicated at logic block 123. This suffix is used to determine the number of operands to be popped from the stack. The stack operands and the operator are passed to a procedure which determines the ordering of the transistors as indicated in logic block 124, with a flowchart of FIG. 21 providing a more detailed functional description of logic block 124. As indicated at logic block 126 the pointer is sequentially advanced to each successive token. At logic block 127 a determination is made whether or not a pointer has reached the end of the string. If the pointer has not reached the end of the string, the program loops back to logic block 122 to examine the following token in the string. If, on the other hand, the pointer has reached the last token in the string, the procedure advances to logic block 128 to pop the stack to obtain the ordering of the transistors. It is seen therefore, that the process had continued until the last operator, which is a NOT read from the string. The operand at the top of the stack consists of the required ordering and type of composition for the full function.

Figure 21A:
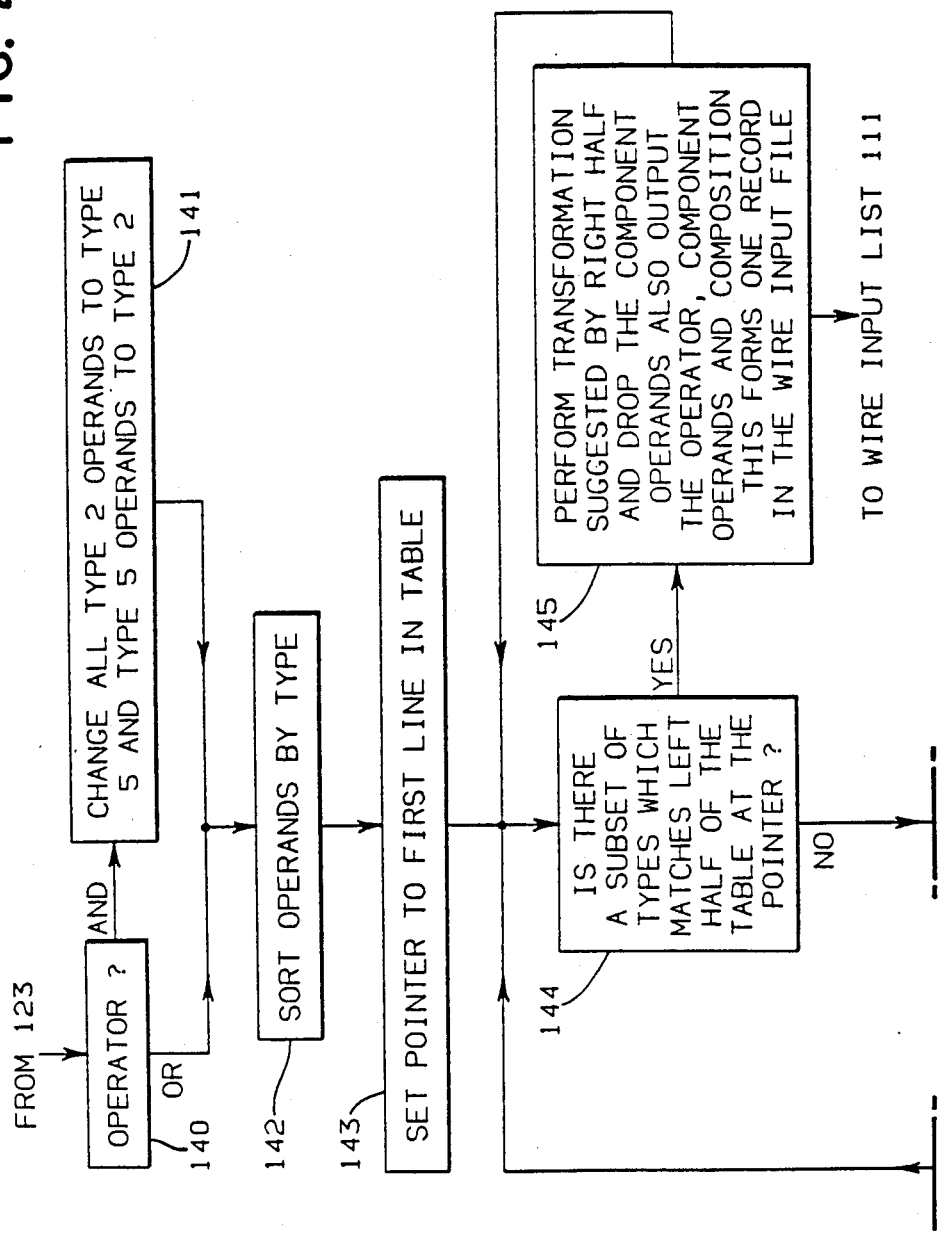
FIG. 21 is a more detailed flow chart representation of the partial ordering function which is shown generally in logic block 124 of FIG. 20.

Refer now to FIG. 21 which is a more detailed logic flowchart of logic block 124 of FIG. 20 for determining the partial ordering of transistors. Once it is determined that the token being examined is an operator, the procedure advances to logic block 140 to determine if the operator is an AND or OR function. If the token is an AND function the procedure advances to logic block 141 and if the operand is 2 or 5, then the type is changed to a 5 or 2 respectively, in accordance with Table 1. Following this operation, the program advances to logic block 142 for either an OR or AND operand, and all of the operands are sorted by type. The program then advances to logic block 143 to set a pointer to the first line in Table 1, to examine the operands to see if there is a subset of operands satisfying the criteria in the left half of the first line in Table 1. Specifically, this line asks for 3 operands, each of type 1. If 3 operands of type 1 are found then the strings corresponding to these operands are concatenated as indicated in the second half of the table. It also indicates that the type of the composed string is a 1. This logical operation is performed at logic block 144 and at logic block 145 a record of successful operations performed at this stage is output as the wire input list. If there are no matches in the left half of the table, the program advances to logic block 146 to advance the pointer in the table. Logic block 147 then determines if the end of the table has been reached. If it has not the program loops back to logic block 144 to once again look for matches in the left half of the table. If the end of the table has been reached, the program advances to logic block 148 to determine the type of operator. If an AND operator is found the logic advances to logic block 149 and the type is changed from 2 to type 5 and type 5 compositions are changed to type 2. The program then advances to logic block 150 to output the final composition which forms the transistor ordering, along with the type information.

Figures 22, 22B:
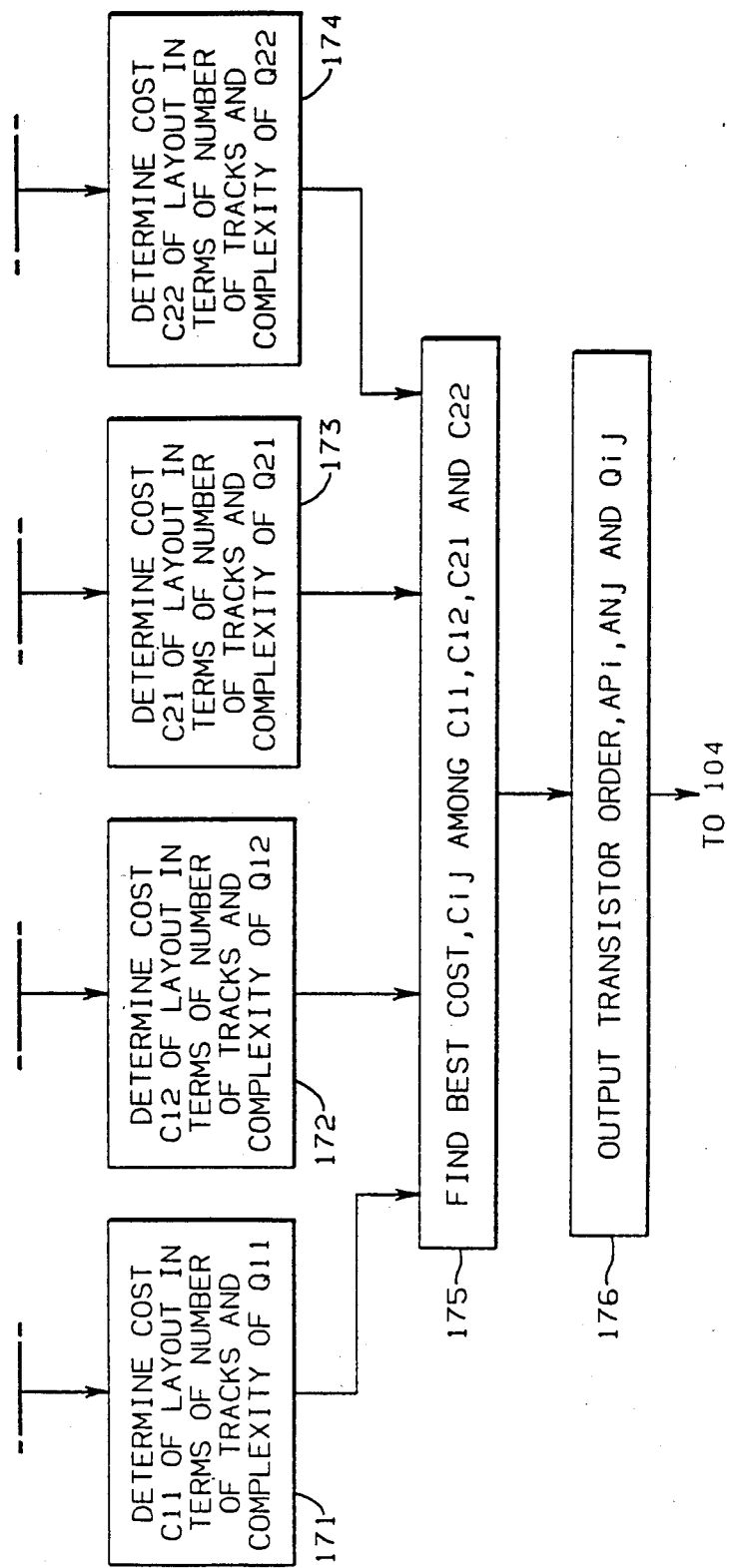
FIG. 22A and B are a more detailed flow chart representation of logic block 111 of FIG. 18.
Figure 22A:
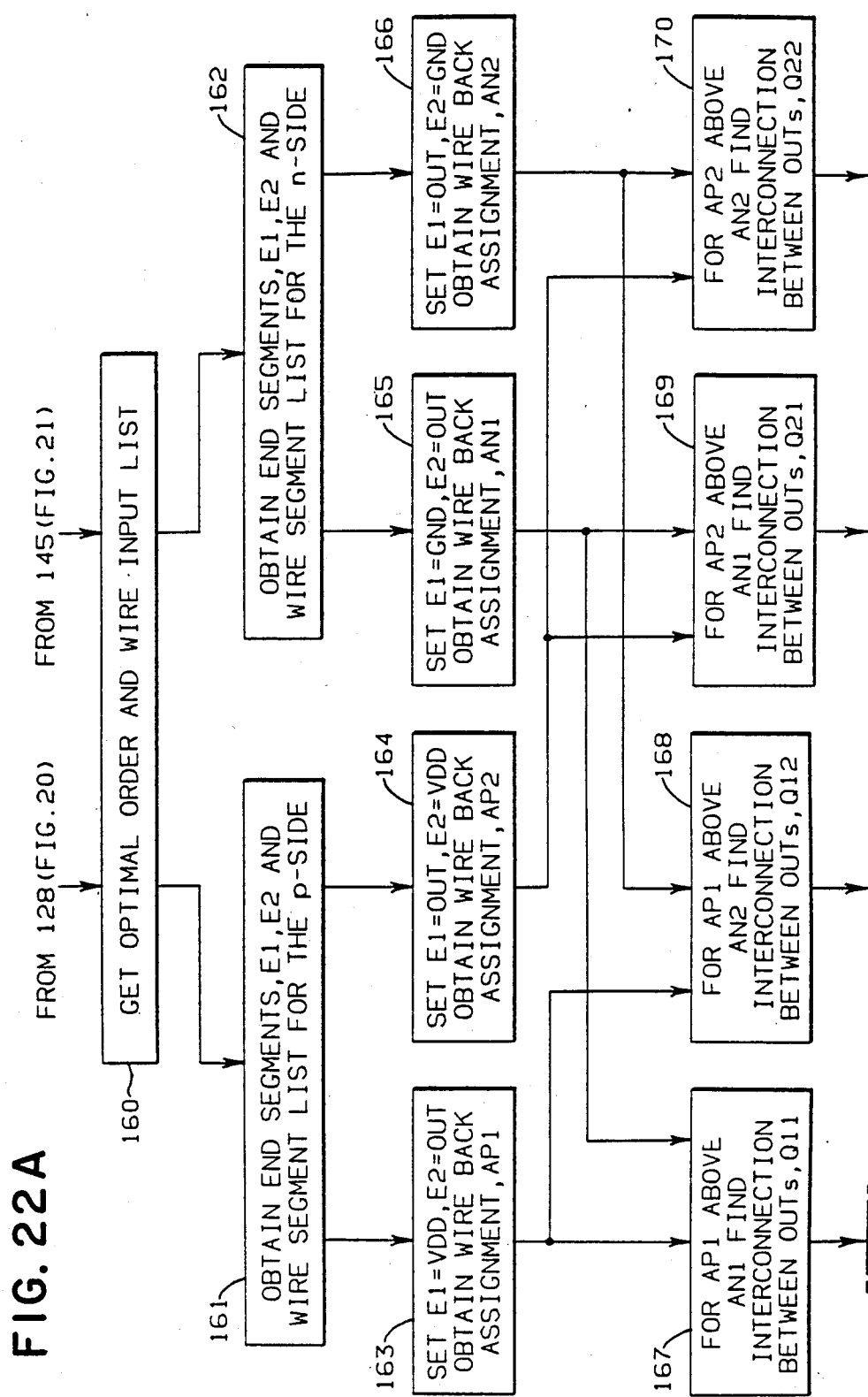

FIG. 22 is a more detailed logic flowchart representation of logic block 111 of FIG. 18 which shows an overview of the procedure involved in assigning wire segments to tracks in order to interconnect the devices. The order of the transistors as provided by logic block 128 and a wire input list as provided by logic block 145 are applied as inputs to logic block 160 to produce an optimal order and wire input list. At logic block 161 the orderings are collected to determine a wire segment list for the p-side, and logic block 162 accomplishes the same task for the n-side of the device. Two segments in each of the segment lists are distinguished as end segments. For the p-side, one of these segments may act as the VDD power segment and the other as the output point. For the n-side, one of the segments is to be the GND segment and the other the output segment. All possible combinations of end segment assignments, which total 4, as indicated at logic blocks 163–166, are chosen to determine a segment-to-track assignment and output interconnection. The number of interconnections between outputs and the various transistors is determined at logic blocks 167–170. A cost is associated with each of the end segmented assignments. This cost, as indicated at logic blocks 171–174, is a function of the number of tracks that are needed as indicated at logic blocks 163–166, along with the measure of the complexity of n-side output to p-side output connections. The end segment assignment which leads to the lowest costs is then chosen as indicated in logic block 175, and a corresponding segment-to-track assignment and output interconnection are calculated as indicated at logic block 176 and are output as the required final "sticks" implementation of the function.

Figure 23B:
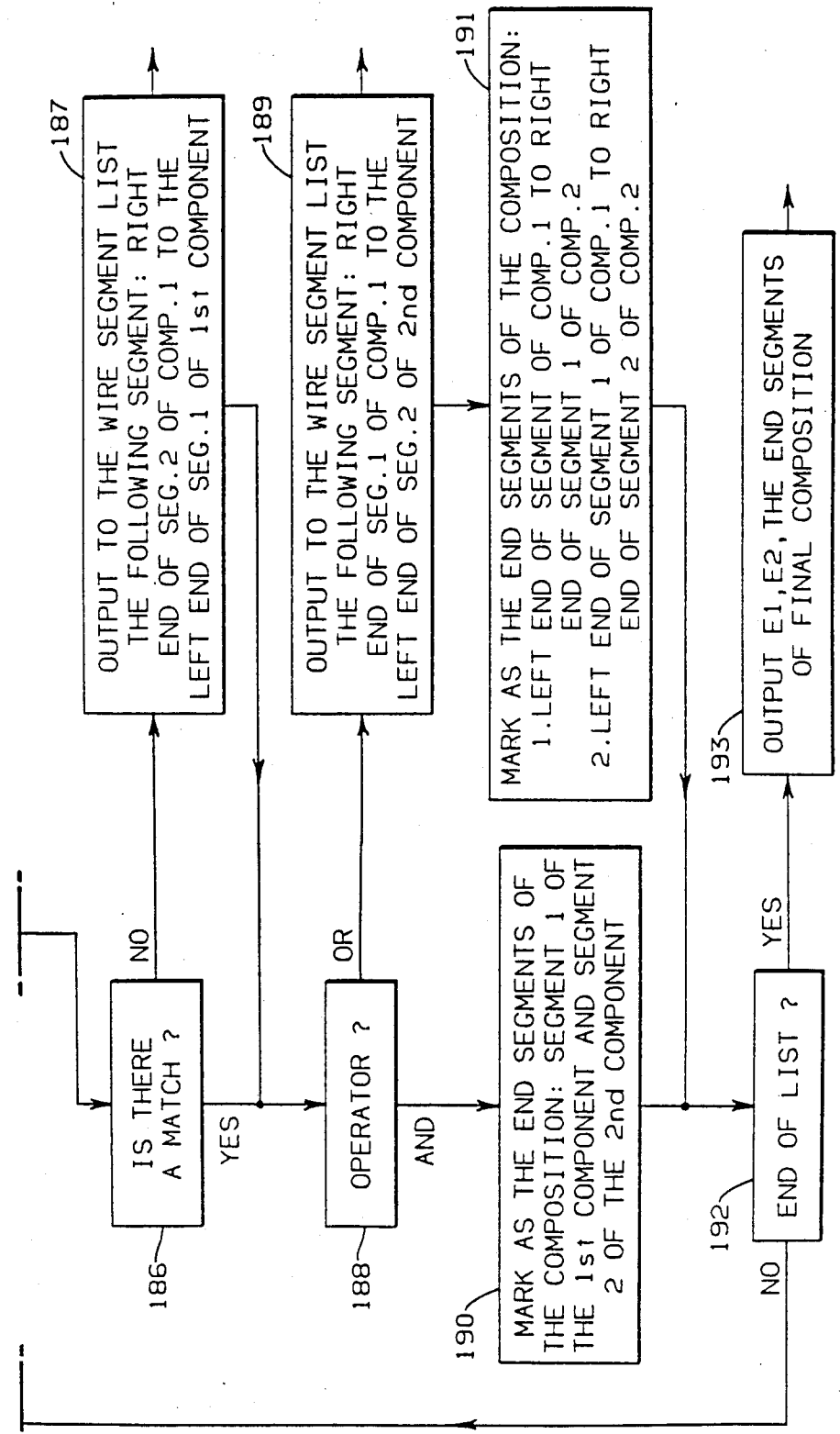
FIG. 23 is a more detailed flow chart representation of logic blocks 161 and 162 of FIG. 22.

FIG. 23 is a detailed logic block diagram of the logic functions accomplished in logic blocks 161 and 162 of FIG. 22, that is the procedure for obtaining wire segment lists and end segments. A line is read from the wire input list into the logic block 180. This line, which recorded a composition process involving Table 1, indicates the component strings, composition strings and the operator involved. The operator is determined to be from the p-side or not as indicated logic block 181. If the operator is from p-side, the program advances to logic block 182 and the operator is reversed from AND to OR or vice versa, if the wire segment list is being determined for p-side, because of the dual nature of the two sides. The component operands may be either compositions themselves or primitive operands of type 1. If they are simply primitive operands then their end segments degenerate to points corresponding to the source and drain positions of the transistor associated with the operand. The end segment of a non-primitive operand will be generated recursively. Note that a segment is defined by a pair of points corresponding to the end of the segments themselves. At logic block 183 a determination is made whether the end segments are defined for the components. If not, the program advances to logic block 184 where the segments are sorted according to the right ends of the first component operand and according to the left ends for the second component operand. In cases where the composition does not introduce a diffusion break a match will be found between the right end of the second segment of the first component and the left end of the first segment of the second component as indicated at logic block 185. If a match is not found as indicated at logic block 186, an addition is made to the wire segment output list connecting these two points as indicated at logic block 187. Further, if the operator is an OR as indicated at logic block 188, it is also necessary to wire the other two end segments together as indicated at logic block 189. Hence, the logic blocks 188 and 189 indicate that another segment must be output to the wire segment list from the right end of the first end segment of the first component to the left end of the second segment of the second component.

If the operator is an AND, as indicated at logic block 190, the end segments of the composition are the first segment of the first component and the second segment of the second component. These are the two components not involved in the match above. For the case of an OR operator the end segments are the two new segments created as above for wire segment list. As indicated by logic blocks 187, 189 and 193, the wire segment list along with the end segments form the output of this procedure. At logic block 192 a determination is made if the end of the list has been reached. If not the program loops back to logic block 180 for another iteration. On the other hand if it is the end of the list, the program proceeds to logic block 193 and the end segments are output.

Figure 24:
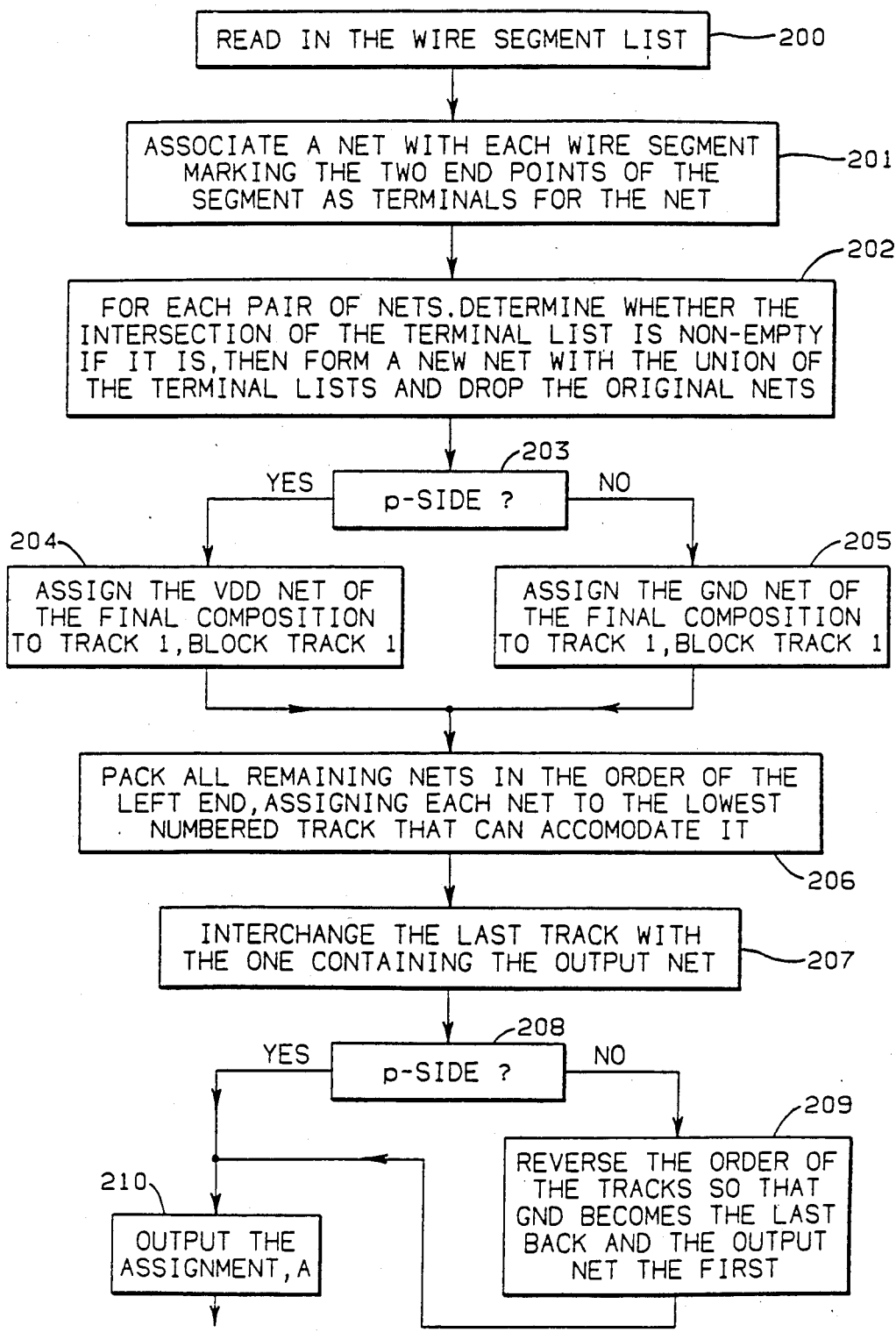
FIG. 24 is a more detailed flow chart representation of the function of logic blocks 163–166 of FIG. 22.

FIG. 24 is a more detailed logic flowchart of the track assignments as indicated in logic blocks 163–166 of FIG. 22. The wire segment list is read in as indicated at logic block 200. The program proceeds to logic blocks 201 and 202 which represents a procedure to examine all closed sets of segments. A closed set of segments is a set of segments which does not share an end point with a segment in another closed set. Each closed set is represented by a net which has as its terminals, the union of the end points of all segments within the set. The program advances to logic block 203 to determine if the p-side is being considered. If not, the program advances to logic block 205 to assign ground net of the final composition to track 1. If so, the program advances to logic block 204 to assign the VDD net of the final composition to track 1. In either case, track 1 is blocked. The program then advances to logic block 206, and the list of nets, excluding the power net, is now sorted by the leftmost terminal. A "greedy" algorithm is used to assign each net in turn to the lowest-numbered track, starting at 2, that can accommodate it. This is like the traditional problem of stick-packing. When all the nets have been assigned, the last track is interchanged with the one that contains the output net in each of the n- and p-sides as indicated at logic block 207. The program then advances to logic block 208 to again determine if this is a p-side operation. If not, the program advances to logic block 209 and the entire n-track orientation is flipped so that the GND track is at the bottom. The program then advances to logic block 210 and the track assignment is output.

As previously outlined in logic blocks 167 to 170 of FIG. 22, the p-side tracks are laid above the n-side, so that the output tracks on the two sides are adjacent to each other. A connection is now determined between the outputs.

Figure 25:
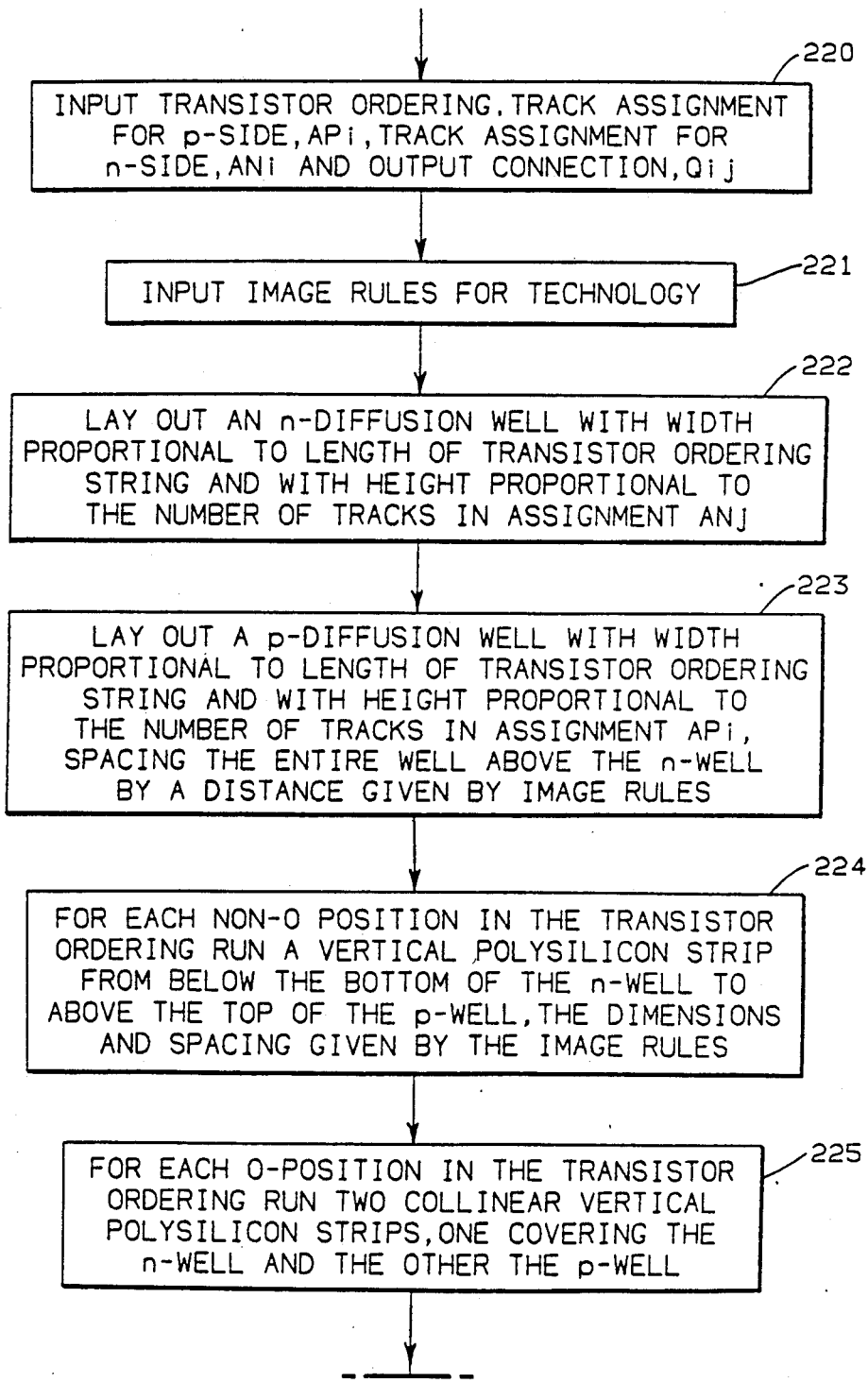
FIGS. 25 and 26 taken with FIG. 25 on the top and FIG. 26 on the bottom is a flow chart representation of a method of converting the "sticks" representation of FIG. 17 to an actual layout for the CMOS implementation in silicon.

FIGS. 25 and 26 taken with FIG. 25 on the top and FIG. 26 on the bottom comprise a logic flowchart which outlines the procedure to "flesh" the "sticks" representation of FIG. 17 so that a full implementation of the CMOS device can be obtained in silicon according to the rules of the technology, and according to the specification of the image. The input for this procedure is shown in logic block 220 and consists of the transistor ordering and the "sticks" representation providing the track assignments for p- and n-sides and the route of the output connection. In addition, the rules of the technology and the image are input of the program as indicated at logic block 221. These include the allowed spacing between devices, the minimum width diffusion wells, the size of contacts, the size of the busses, the width of metal interconnections, and so on. The program advances to logic blocks 222–223 to determine a specific layout of p-diffusion and n-diffusion well widths proportional to length of transistor ordering string, and with height proportional to the number of tracks in the assignment. Two wells are laid out as indicated at logic blocks 223 and 224 with the diffusion well for the p-side being laid above that of the n-side. The widths of the two wells are identical and directly proportional to the length of the transistor ordering string, which in turn is simply equal to the number of transistors plus the number of diffusion breaks. The program then advances to logic blocks 224, 225 and 226. A metal strip is laid out as wide as required by the technology ground rules, one on the p-side and one on the n-side to carry power. The bus extends across the entire diffusion areas with the VDD bus position at the top of the p-well and the ground bus at the bottom of the n-well.

Each "O"-position in the ordering corresponds to isolation device. For each such position, one polysilicon strip is laid out on the n-side and one on the p-side extending vertically, and overlapping the diffusion as provided by the technology ground rules. Contacts are made from the transistor thus formed to the ground bus on the n-side and the VDD bus on p-side. For each non-"O"-position in the transistor ordering string, a vertical polysilicon strip is laid out, extending from the bottom of the n-well to the top of the p-well as indicated at logic block 224.

The program advances to logic block 227 which indicates that the tracks between the power buses are laid out one by one, with horizontal non-touching metal segments for each net. The program advances to logic block 228 where contacts are made at each metal segment to the diffusion areas according to the list of terminals for the net corresponding to the metal segment. The program then advances to logic block 229 where finally vertical metal segments are laid out to interconnect the output segment on the p-side to that on the n-side, and the final CMOS layout is accomplished.

Industrial Applicability

It is an object of the invention to provide a method for generating the layout of semiconductor devices.

It is another object of the invention to provide a method for generating the layout of CMOS cells.

It is yet another object of the invention to provide a method for generating the layout of CMOS cells from a high-level functional description of the cells, as well as generating the particular details of the CMOS devices.

It is still another object of the invention to provide a method for generating the layout of CMOS cells from a high-level functional description of the cells, for example, a Boolean equation, as well as generating the particular details of the CMOS device, with the image of the semiconductor chip being formed with the polysilicon gates of the transistors on the n-side vertically aligned with those of the p-side to minimize the wiring effort, and the interconnections between the source and drains being orthogonal to the gates, and running along one layer of metal.

Having thus described my invention, what I claim as new, and desire to secure by Letters Patent is:

1. A method of operating a computing system to automatically generate a layout of a CMOS cell on a semiconductor chip from the Boolean representation of the function to be implemented by said cell on said semiconductor chip and from predetermined technology rules detailing widths and spacing of devices comprising said representation of said CMOS cell, said method comprising the steps of:
   reading said Boolean representation of the function to be implemented into said computing system;
   converting said Boolean representation into a special post fix notation;
   determining the optimal order of transistors in said CMOS cell layout, including the optimal interconnections
   therebetween to produce a representation of said CMOS cell layout in response to the said postfix representation of the function;
   reading said technology rules into said computing system; and
   determining the topology of the silicon diffusion layers and the metal interconenct layers for said CMOS cell based on said Boolean function.

2. The method of claim 1, wherein said step of determining the optimal order comprises the steps of:
   determining the optimal ordering of transistors and isolation devices in said CMOS cell to minimize circuit width, and determining the assignment of transistor interconnection segments of horizontal metal tracks such that the heights of the n and p sides of said CMOS cell are minimal.

3. The method of claim 2 wherein said step of determining the optimal ordering of transistors and isolation devices comprises the steps of:
   examining each element of the said postfix string in turn;
   pushing each said element along with its type on a push-down stack if the element is an operand;
   composing an order for the top operands in the stack according to tabulated rules if said element is an operator;
   pushing said composition on the push-down stack; and
   continuing the process until said postfix string is completely processed.

4. The method of claim 1 wherein said step of determining the optimal interconnections between the transistors comprises the steps of:
   assigning the power and output points on the cell in four different combinations;
   allocating track to the interconnection paths in an orderly manner for each of the assignments, and
   choosing that assignment and allocation which results in the occupation of the least number of tracks.

5. The method of claim 2 wherein said step of determining the optimal interconnections between the transistors comprises the steps of:
   assigning the power and output points on the cell in four different combinations;
   allocating tracks to the interconnection paths in an orderly manner for each of the assignments; and
   choosing that assignment and allocation which results in the occupation of the least number of tracks.

6. A method of operating a computing system to automatically generate a layout of a CMOS cell on a semiconductor chip from the Boolean representation of the function to be implemented by said cell on said semiconductor chip technology rules detailing widths and spacings of devices comprising said representation of said CMOS cell, said method comprising the steps of:
   reading said Boolean representation of the function to be implemented into said computing system;
   converting said Boolean representation into a late operator reverse polish notation;
   determining the optimal order of transistors in said CMOS cell layout, including the optimal interconnections therebetween to produce a representation of said CMOS cell layout in response to the said late operator reverse representation of the function;
   reading said technology rules into said computing systems; and
   determining the topology of the silicon diffusion layers and the metal interconnect layers for said CMOS cell based on said Boolean function.

7. The method of claim 6, wherein said step of determining the optimal order comprises the steps of:
   determining the optimal ordering of transistors and isolation devices in said CMOS cell to minimize circuit width, and
   determining the assignment of transistors interconnection segment of horizontal metal tracks such that the heights of the n and p sides of said CMOS cell are minimal.

8. The method of claim 7 wherein said step of determining the optimal ordering of transistors and isolation devices comprises the steps of:
   examining each element of the late operator reverse polish string in turn;
   pushing said element along with its type on a push-down stack if the element is an operand;
   composing an order for the top operands in the stack according to tabulated rules if said element is an operator;
   pushing said composition on the push-down stack; and
   continuing the process until said late operator reverse string is completely processed.

9. The method of claim 7 wherein said step of determining the optimal interconnections between the transistors comprises the steps of:
   assigning the power and output points on the cell in four different combinations;
   allocating tracks to the interconnection paths in an orderly manner for each of the assignments; and
   choosing that assignment and allocation which results in the occupation of the least number of tracks.

10. The method of claim 6 wherein said step of determining the optimal interconnections between the transistors comprises the steps of:
   assigning the power and output points on the cell in four different combinations;
   allocating tracks to the interconnection paths in an orderly manner for each of the assignments, and
   choosing that assignment and allocation which results in the occupation of the least number of tracks.

11. A method operating a computing system to automatically generate layouts of CMOS cells on a semiconductor chip from the Boolean representation of the function to be implemented by said cells on said semiconductor chip and from predetermined technology ground rules detailing widths and spacing of devices comprising said representation of said CMOS cell, said method comprising the steps of:
   reading said Boolean representation of the function to be implemented into said computing system;
   converting said Boolean representation into a late operator reverse polish form;
   combining contiguous strings of identical ones of the operators to form a single operator suffixed by 1 plus the number of operators combined;
   determining the optimal order of transistors in said CMOS cell layout, including the optimal interconnections therebetween to produce a representation of said CMOS cell layout in response to the combining of said contiguous strings;
   reading said technology ground rules into said computing systems; and
   determining the topology of the silicon diffusion layers and the metal interconnect layers for said CMOS cell based on said Boolean function.

* * * * *